United States Patent

[11] 3,577,632

[72] Inventor Ernst Hofmeister
Munich, Germany

[21] Appl. No. 859,596
[22] Filed Sept. 18, 1969
[45] Patented May 4, 1971
[73] Assignee Siemens Aktiengesellschaft
Berlin, Germany
Continuation of application Ser. No. 635,919, May 3, 1967, now abandoned.

[54] METHOD OF PRODUCING SEMICONDUCTOR DEVICE IN GLASS HOUSING

4 Claims, 1 Drawing Fig.

[52] U.S. Cl. 29/585, 29/588, 29/584
[51] Int. Cl. B01j 17/00, H01l 7/20
[50] Field of Search 29/588, 585, 574, 586, 584; 317/23, 4, 3.1

[56] References Cited

UNITED STATES PATENTS

| | | | |
|---|---|---|---|
| 2,444,312 | 6/1948 | Roberds et al. | 220/67 |
| 2,694,168 | 11/1954 | North et al. | 29/587 |
| 2,746,121 | 5/1956 | Anderson | 29/574 |
| 2,998,557 | 8/1961 | Van Amstel | 29/588 |
| 3,172,188 | 5/1965 | Wood | 29/586 |
| 3,178,796 | 4/1965 | Smits | 29/574 |
| 3,376,376 | 4/1968 | Smith | 29/588 |

FOREIGN PATENTS

| | | | |
|---|---|---|---|
| 1,167,970 | 12/1958 | France | 29/584 |

*Primary Examiner*—John E. Campbell
*Assistant Examiner*—W. Tupman
*Attorneys*—Curt M. Avery, Herbert L. Lerner, Arthur E. Wilfond and Daniel J. Tick

ABSTRACT: An electrical conductor is extended through an open end of a glass housing into permanent electrical contact with a semiconductor body of a semiconductor device affixed to and supported by an electrically conductive support member. The open end of the housing is hermetically sealed by heating such open end. The support member passes through the opposite closed end of the housing. An electrical current is passed through the semiconductor device via the support member and the electrical conductor during the hermetic sealing of the open end of the housing.

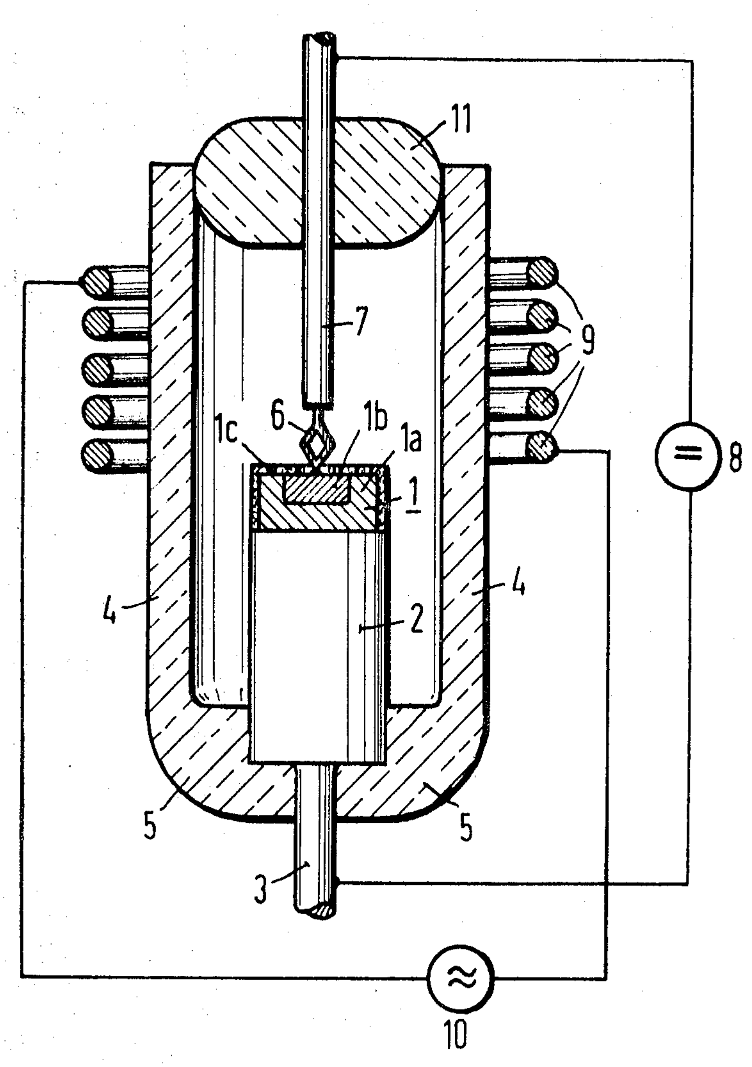
11
7
9
6
1c
1b
1a
1
8
4
2
4
5
5
3
10

METHOD OF PRODUCING SEMICONDUCTOR DEVICE IN GLASS HOUSING

This is a continuation of Ser. No. 635,919, filed May 3, 1967, and now abandoned.

DESCRIPTION OF THE INVENTION

The present invention relates to a method of producing a semiconductor device. More particularly, the invention relates to a method of producing a semiconductor device in a glass housing.

In accordance with the state of technology, semiconductor components, including diodes and transistors, are mounted in housings, consisting at least partially of electrical insulating material such as, for example, glass. Thus, a method of producing a semiconductor diode is known wherein the diode is arranged in a housing made entirely of glass. To produce such a diode, a small glass tube of cylindrical shape is utilized. The tube is provided with a glass bead which seals the tube at one end. An electrically conductive lead, which supports the semiconductor diode, passes in a vacuumtight manner through the bead. A second electrically conductive lead for the diode passes in a vacuumtight manner through another sealed-in glass bead.

The foregoing method is described, for example, in British Pat. No. 721,201, which discloses all the details. The electrical properties or characteristics of the diode must be fixed and this is usually done after installation of the diode in the housing. After the hermetic sealing process is completed, the diode and the housing are again heated for a longer period or subjected to the effect of an electrical current. In a semiconductor device of planar type, enclosed by a glass housing, when the housing is sealed, the protective layer on the surface of the device, and in some cases even the surface of the semiconductor body may become contaminated by the vaporization of disturbance atoms, particularly alkali atoms.

The principal object of the present invention is to provide a new and improved method of producing a semiconductor device in a glass housing. The method of the present invention avoids the disadvantages of the methods of the prior art. The method of the present invention not only saves time compared to the methods of the prior art, but provides considerably improved characteristics or properties of the semiconductor device by preventing an ion migration to the semiconductor body or its protective oxide layer. The method of the present invention is efficient, effective and reliable in operation.

The method of the present invention is for producing a semiconductor device of planar type in a glass housing having a closed end and an opposite open end. The semiconductor device includes an electrically conductive support member and a semiconductor body affixed to and supported by the support member. In accordance with the present invention, the method comprises extending an electrical conductor through the open end of the housing and into permanent electrical contact with the semiconductor body. The open end of the housing is hermetically sealed by heating the open end. An electrical current is passed through the semiconductor device via the support member and the electrical conductor during the hermetic sealing of the open end of the housing.

The current passed through the semiconductor device is passed for a period of time and has a magnitude for completely stabilizing the characteristic line of the semiconductor device. The closed end of the housing is hermetically sealed by a glass bead through which the support member passes and the hermetic sealing of the open end of the housing is by heating a glass bead through which the electrical conductor passes. The housing is a glass tube. The current passed through the semiconductor device is passed for a period of 10 to 40 seconds at a magnitude of 3 milliamperes. The passing of the current through the semiconductor device may be initiated before the open end of the housing is hermetically sealed and may continue after the open end of the housing is hermetically sealed.

In order that the present invention may be readily carried into effect, it will now be described with reference to the accompanying drawing, wherein the single FIGURE is a schematic diagram of apparatus for completing the method of the present invention.

In the production of a planar diode, a surface zone of opposite conductivity type is produced by diffusion in a monocrystalline semiconductor body of, for example, silicon. A protective coating, preferably of silicon dioxide, is customarily utilized. The protective coating is locally removed from only a portion of the surface of the semiconductor crystal. An activator is diffused into such portion of the surface of the semiconductor crystal in a conventional manner from a gaseous phase, under the formation of a PN junction. After completion of the diffusion process, the semiconductor crystal is provided at appropriate contact points with a metal support member which functions as an electrode, and with a second electrode which contacts the zone on the other side of the PN junction. Each of the electrodes is electrically connected to an electrically conductive lead.

The support member normally extends through the wall of a glass housing via a hermetic seal enclosing said support member and the semiconductor crystal is mounted on said support member. A second lead is then passed through the open opposite end or side of the housing and is extended until it makes electrical contact with the second electrode of the semiconductor device which is provided therefor. This is accomplished by an adjusting device. The permanent contacting of the second lead with the second electrode is accomplished via a glass seal in accordance with the disclosure of the aforementioned British Pat. No. 721,201. At this point in the method, illustrated in the FIGURE, the invention commences.

In the FIGURE, the semiconductor body 1 of a semiconductor device such as, for example, a diode has two zones 1*a* and 1*b* of opposite conductivity type. An insulating protective layer 1*c*, preferably of silicon dioxide, is provided on the surface of the diode, as is customary for planar diodes. The zone 1*a* of the semiconductor body 1 is soldered to a metal support member 2 and is thereby electrically connected to said support member. The support member 2 has an extending portion 3 which extends through the closed end or closed side 5 of the housing 4. The support member 2 simultaneously serves as an electrical lead for the semiconductor diode.

The housing 4 is preferably a glass tube 4 having a closed end 5 which is hermetically sealed by glass through which the support member portion 3 extends in a vacuumtight manner. The opposite end of the glass tube 4 is open. An electrically conductive second lead 7 terminates in a loop, contact, whisker or the like 6. The lead 7 extends through the open end of the housing 4 and is placed in permanent electrical contact with the zone 1*b* of the semiconductor body 1 or an electrode in said zone and said lead is fixed in position.

In accordance with the present invention, at this stage of the method, an electrical current is passed through the semiconductor diode. The current is provided by a source 8 of electrical current which is connected between the extending portion 3 of the support member 2 and the second lead 7. At the same time that the current is passed through the diode, the open end of the housing 4 is sealed hermetically around the second lead 7. The hermetic sealing of the open end of the glass tube 4 is accomplished by heating which is provided by electrically energizing a heating coil 9 by a source 10 of electrical energy which is connected between the ends of said heating coil. A glass bead 11 is positioned in the open end of the glass tube 4 and the lead 7 is passed through said bead as soon as it is softened by the heat. The glass bead 11 then hermetically seals the open end of the housing 4 and provides a hermetic seal for the lead 7.

The magnitude and duration of the electric current passed through the semiconductor diode is determined by experience. If the diode is a planar diode, excellent results are obtained if a current of about 3 milliamperes is passed therethrough in the blocking direction during the sealing of the open end of the housing, at a sealing temperature of approximately 850° C., which heats the semiconductor device to a temperature of about 200° to 250°C. The duration of the sealing period is approximately 10 to 14 seconds. The voltage which develops the current in the diode may be applied, as previously mentioned, even in a cold condition, that is, after the installation and adjustment of the diode, and does not need to be discontinued until after the sealing process is completed.

When the method of the present invention is utilized, the breakdown voltage of the semiconductor device may be increased by 30 percent. The method of the present invention may be utilized with semiconductor devices including diodes and transistors. The simultaneous passage of an electric current through the semiconductor device during the sealing of the housing prevents an unfavorable intrusion of disturbance atoms, such as alkali atoms, into the semiconductor device. Generally, the magnitude of the electric current and its duration are a matter of individual selection of the operator. It is thus preferable to periodically determine the shifting of characteristic lines relative to the end result.

The advantage of the method of the present invention over a method which adjusts the device only after the sealing of the housing is completed, lies primarily in the fact that the breakdown voltage is considerably increased and stabilized. This is also true as far as a method which adjusts the device before it is installed in the device is concerned. If the adjustment is made during the sealing of the housing, in accordance with the present invention, however, disturbance atoms are kept from the semiconductor device.

While the invention has been described by means of a specific example and in a specific embodiment, I do not wish to be limited thereto, for obvious modifications will occur to those skilled in the art without departing from the spirit and scope of the invention.

I claim:

1. A method of installing a diode of planar type having a semiconductor body having a PN junction in a glass housing having a closed end and an open end and a support member therein, the support member hermetically passing through the closed end of the housing and functioning as an electrical conductor, said method comprising the steps of affixing the semiconductor body of the planar diode to the support member at one surface of said body;

closing the open end of the housing by positioning a glass bead having an electrical conductor hermetically extending therethrough in the open end of the housing with the electrical conductor thereof in electrical contact the other surface of the diode;

applying a voltage to the planar diode in the reverse direction of the PN junction thereof via the electrical conductor and the support member;

sealing the open end of the housing by fusing the glass bead to said housing at said open end; and maintaining the applied voltage during the sealing of the glass housing.

2. A method as claimed in claim 1, wherein the application of the voltage is continued after the open end of the housing is hermetically sealed.

3. A method as claimed in claim 1, wherein the application of the voltage is continued for a period of time and at a magnitude for completely stabilizing the characteristic line of the diode.

4. A method as claimed in claim 1, wherein the application of the voltage is continued for a period of 10 to 40 seconds at a magnitude of 3 milliamperes.